(12) United States Patent
Chang et al.

(10) Patent No.: US 11,127,586 B2
(45) Date of Patent: *Sep. 21, 2021

(54) SOURCE AND DRAIN PROCESS FOR FINFET

(71) Applicant: TAIWAN SEMICONDUCTOR MANUFACTURING CO., LTD., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/725,975

(22) Filed: Dec. 23, 2019

(65) Prior Publication Data
US 2020/0135449 A1 Apr. 30, 2020

Related U.S. Application Data

(60) Division of application No. 15/921,624, filed on Mar. 14, 2018, now Pat. No. 10,515,793, which is a continuation of application No. 15/417,115, filed on Jan. 26, 2017, now Pat. No. 9,922,816, which is a continuation of application No. 14/984,514, filed on Dec. 30, 2015, now Pat. No. 9,570,567.

(51) Int. Cl.
| | |
|---|---|
| H01L 21/02 | (2006.01) |
| H01L 29/78 | (2006.01) |
| H01L 29/66 | (2006.01) |
| H01L 21/306 | (2006.01) |
| H01L 29/06 | (2006.01) |

(52) U.S. Cl.
CPC .. *H01L 21/02068* (2013.01); *H01L 21/30604* (2013.01); *H01L 29/0649* (2013.01); *H01L 29/66545* (2013.01); *H01L 29/66553* (2013.01); *H01L 29/66795* (2013.01); *H01L 29/785* (2013.01); *H01L 29/7848* (2013.01)

(58) Field of Classification Search
CPC ......... H01L 21/02068; H01L 21/30604; H01L 29/0649; H01L 29/66545; H01L 29/66553
See application file for complete search history.

(56) References Cited

U.S. PATENT DOCUMENTS

| 9,570,567 B1* | 2/2017 | Chang ............... H01L 21/02068 |
| 2011/0147828 A1 | 6/2011 | Murthy et al. |
| 2011/0147842 A1 | 6/2011 | Cappellani et al. |
| 2013/0240950 A1 | 9/2013 | Bohr |

(Continued)

FOREIGN PATENT DOCUMENTS

| CN | 102315268 A | 1/2012 |
| CN | 104681535 A | 6/2015 |

*Primary Examiner* — Dung A. Le
(74) *Attorney, Agent, or Firm* — Maschoff Brennan

(57) ABSTRACT

A method includes forming a dielectric layer over a fin structure, forming a dummy gate crossing over the dielectric layer, forming a spacer on a sidewall of the dummy gate, etching the dielectric layer and the fin structure, such that the dielectric layer and the fin structure are recessed from an outer sidewall of the spacer, and etching the fin structure, such that the fin structure is recessed from an end surface of the dielectric layer.

20 Claims, 10 Drawing Sheets

(56) References Cited

U.S. PATENT DOCUMENTS

| | | |
|---|---|---|
| 2014/0167163 A1 | 6/2014 | Cheng et al. |
| 2014/0227847 A1 | 8/2014 | Yoon et al. |
| 2014/0299934 A1 | 10/2014 | Kim et al. |
| 2014/0361373 A1 | 12/2014 | Hung et al. |
| 2015/0132908 A1 | 5/2015 | Jeong et al. |
| 2015/0171193 A1 | 6/2015 | Cheng et al. |
| 2015/0255571 A1 | 9/2015 | Xu et al. |
| 2016/0005656 A1 | 1/2016 | Ching et al. |
| 2016/0190317 A1 | 6/2016 | Liu et al. |
| 2016/0240534 A1 | 8/2016 | Murthy et al. |

\* cited by examiner

SOURCE AND DRAIN PROCESS FOR FINFET

RELATED APPLICATIONS

This application is a divisional application of U.S. application Ser. No. 15/921,624, filed Mar. 14, 2018, now U.S. Pat. No. 10,515,793, issued Dec. 24, 2019, which is a continuation application of U.S. application Ser. No. 15/417,115, filed Jan. 26, 2017, now U.S. Pat. No. 9,922,816, issued Mar. 20, 2018, which is a continuation application of U.S. application Ser. No. 14/984,514, filed Dec. 30, 2015, now U.S. Pat. No. 9,570,567, issued Feb. 14, 2017, all of which are herein incorporated by reference in their entireties.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such a fin-like field effect transistors (FinFETs). However, conventional FinFET devices and methods of fabricating the FinFET devices have not been entirely satisfactory in every aspect.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
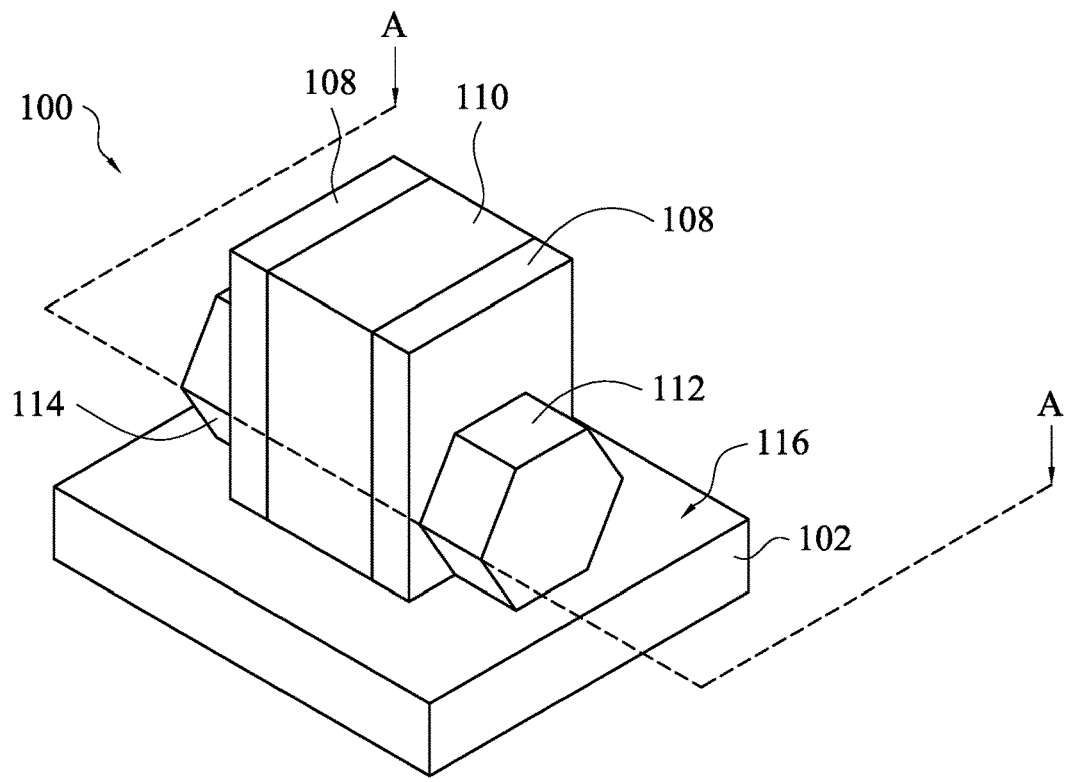
FIG. 1A is schematic three-dimensional diagram of a FinFET in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

In a typical FinFET replacement polysilicon gate (RPG) technology with a high-k metal gate last (HKMG) process, an operation of removing of a portion of a fin structure and a portion of a dielectric layer covering the fin structure needs a high over-etching amount of the fin structure and the dielectric layer, thereby enlarging a process window for each of sequential deposition process of a high-k dielectric layer and a metal gate, thus enhancing a performance of the FinFET. However, the high over-etching amount of the dielectric layer shortens a portion of the dielectric layer that is used for blocking a dummy gate which covers a portion of the dielectric layer and the underlying fin structure, such that an extrusion path is decreased to result in footing of the dummy gate, and thus causing a metal gate extrusion issue.

Embodiments of the present disclosure are directed to providing a FinFET and a method for manufacturing the FinFET, in which a first etching operation is performed on a fin structure and a dielectric layer covering the fin structure to recess the fin structure and the dielectric layer, so as to form two first recesses respectively in two spacers which cover the dielectric layer and the fin structure, and then a second etching operation is performed on the fin structure to further recess the fin structure to form two second recesses in the dielectric layer, in which the seconds respectively communicate with the first recesses. Thus, portions of the dielectric layer used for blocking a dummy gate are lengthened, the dummy gate covering the dielectric layer and the fin structure and being sandwiched between the spacers, such that each extrusion path is increased, thereby enhancing the yield of the FinFET.

Figure 1B:
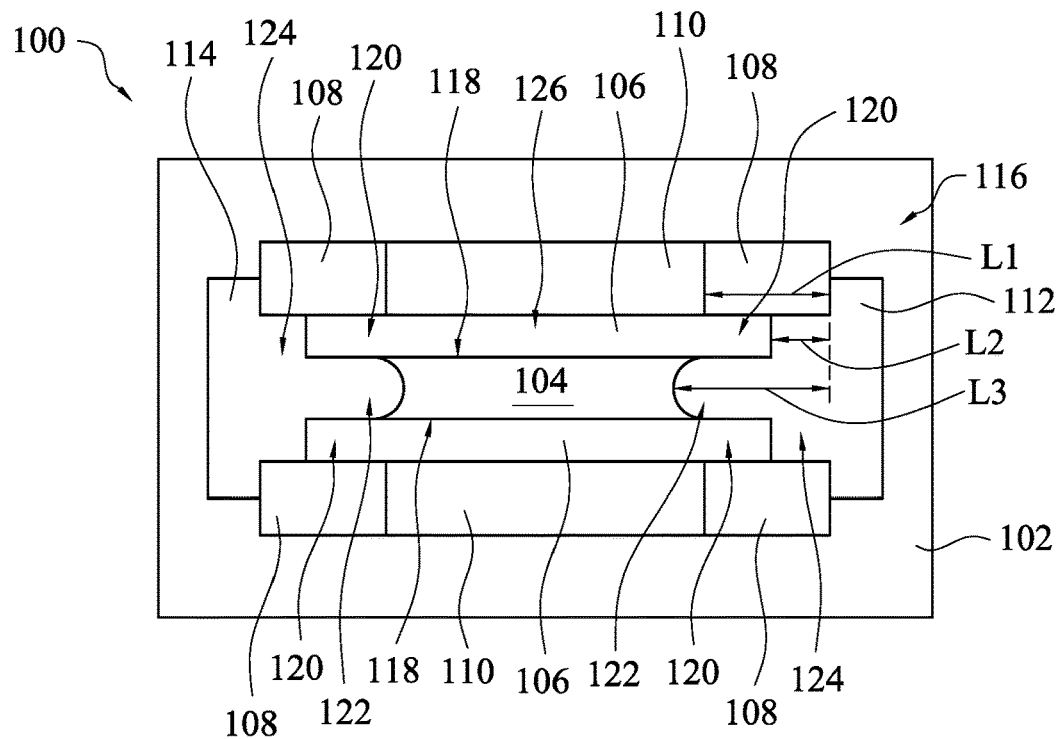
FIG. 1B is schematic top view of the FinFET taken along line A-A of FIG. 1A.

Referring to FIG. 1A and FIG. 1B, FIG. 1A is schematic three-dimensional diagram of a FinFET in accordance with various embodiments, and FIG. 1B is schematic top view of the FinFET taken along line A-A of FIG. 1A. In some embodiments, a FinFET 100 includes a substrate 102, a fin structure 104, a dielectric layer 106, a metal gate 110, two spacers 108, a source 112 and a drain 114. The fin structure 104, the dielectric layer 106, the metal gate 110, the spacers 108, the source 112 and the drain 114 are disposed on the substrate 102.

The fin structure 104 is disposed on the substrate 102. In some exemplary examples, the fin structure 104 is formed by recessing the substrate 102, and thus the fin structure 104 protrudes from a recessed surface 116 of the substrate 102, and the fin structure 104 and the substrate 102 are formed from the same material. The substrate 102 and the fin structure 104 may be composed of a single-crystalline semiconductor material or a compound semiconductor material. For example, silicon, germanium or glass may be used as a material of the substrate 102 and the fin structure 104. In some exemplary examples, the substrate 102 and the fin structure 104 are composed of silicon.

Referring to FIG. 1B again, the dielectric layer 106 is disposed on the fin structure 104 and covers two opposite side surfaces 118 of the fin structure 104. The dielectric layer 106 includes two first portions 120, in which the first portions 120 disposed at two opposite ends of the dielectric layer 106. A cross-section of each of the first portions 120 is in an inverted U-shape. Each of the first portions 120 of the dielectric layer 106 protrudes from the side surfaces 118 of the fin structure 104 to form a first recess 122 in the dielectric layer 106. Thus, the first recesses 122 are opposite to each other. In some examples, the fin structure 104 and the dielectric layer 106 are formed from different materials, such that the dielectric layer 106 has an etching selectivity with respect to the fin structure 104 during an operation of etching the fin structure 104. For example, the fin structure 104 may be formed from silicon, and the dielectric layer 106 may be formed from silicon oxide.

Referring to FIG. 1A and FIG. 1B, the metal gate 110 is disposed on a second portion 126 of the dielectric layer 106. In the dielectric layer 106, the second portion 126 is adjacent to the first portions 120, in which the first portions 120 are located at two opposite ends of the second portion 126, such that the second portion 126 is sandwiched between the first portions 120. A cross-section of the metal gate 110 is in an inverted U-shape.

As shown in FIG. 1A and FIG. 1B, the spacers 108 are respectively disposed on the first portions 120 of the dielectric layer 106. A cross-section of each of the spacers 108 is in an inverted U-shape. The spacers 108 respectively protrude from the first portions 120 of the dielectric layer 106 which are covered by the spacer 108, so as to form two second recesses 124 in the spacers 108. The second recesses 124 correspondingly communicate with the first recesses 122. In some examples, the spacers 108 and the fin structure 104 are formed from different materials, such that the spacers 108 have an etching selectivity with respect to the fin structure 104 during an operation of etching the fin structure 104. In some exemplary examples, the spacers 108, the dielectric layer 106 and the fin structure 104 are formed from different materials. For example, the spacers 108 may be formed from silicon nitride, while the fin structure 104 may be formed from silicon, and the dielectric layer 106 may be formed from silicon oxide.

As shown in FIG. 1B, the fin structure 104 is further recessed to form the first recesses 122, such that a length L1 of each spacer 108 is greater than a length L2 of each second recess 124, and a length L3 of a combination of the first recess 122 and the corresponding second recess 124 is greater than the length L1 of each spacer 108. In some exemplary examples, the length L1, the length L2 and the length L3 are within a range from 0.5 Å to 100 Å.

As shown in FIG. 1A and FIG. 1B, the source 112 is disposed in one of the first recess 122 and the corresponding second recess 124 on the substrate 102, and protrudes from the second recess 124. In addition, the drain 114 is disposed in the other one of the first recess 122 and the corresponding second recess 124 on the substrate 102, and protrudes from the second recess 124. Each of the source 112 and the drain 114 has a first portion peripherally enclosed by the dielectric layer 106, and a second portion peripherally enclosed by the two spacers 108, in which a length of the second portion is the aforementioned length L2 of each second recess 124, and a length of a combination of the first portion and the second portion is the aforementioned length L3. In some examples, the source 112 and the drain 114 may extend through the recessed surface 116 into the substrate 102. For example, each of the source 112 and the drain 114 may include an epitaxy layer. In some exemplary examples, the source 112 and the drain 114 are formed from silicon germanium (SiGe).

Referring to FIG. 1B again, the first recesses 122 are respectively formed in the first portions 120 of the dielectric layer 106, such that extrusion paths of the metal gate 110 are increased with the existence of the first portions 120 of the dielectric layer 106, and thus the metal gate 110 can be effectively blocked by the first portions 120 of the dielectric layer 106, thereby enhancing the yield of the FinFET 100.

Figure 2A:
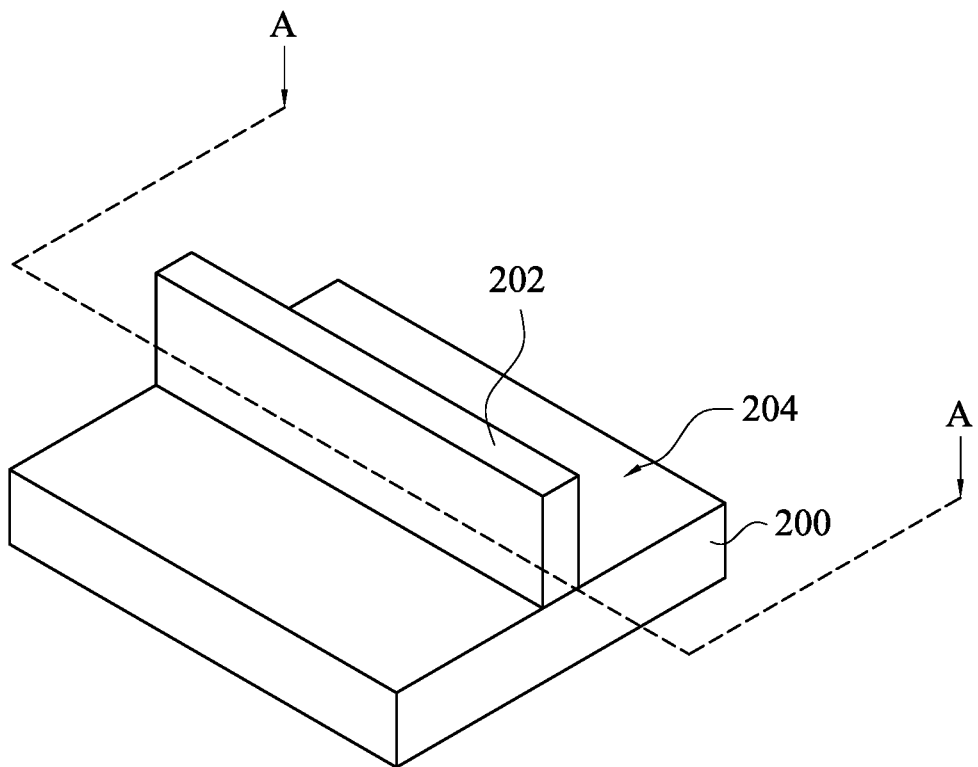
FIG. 2A through FIG. 2G are three-dimensional diagrams of intermediate stages showing a method for manufacturing a FinFET in accordance with various embodiments.
Figure 2B:
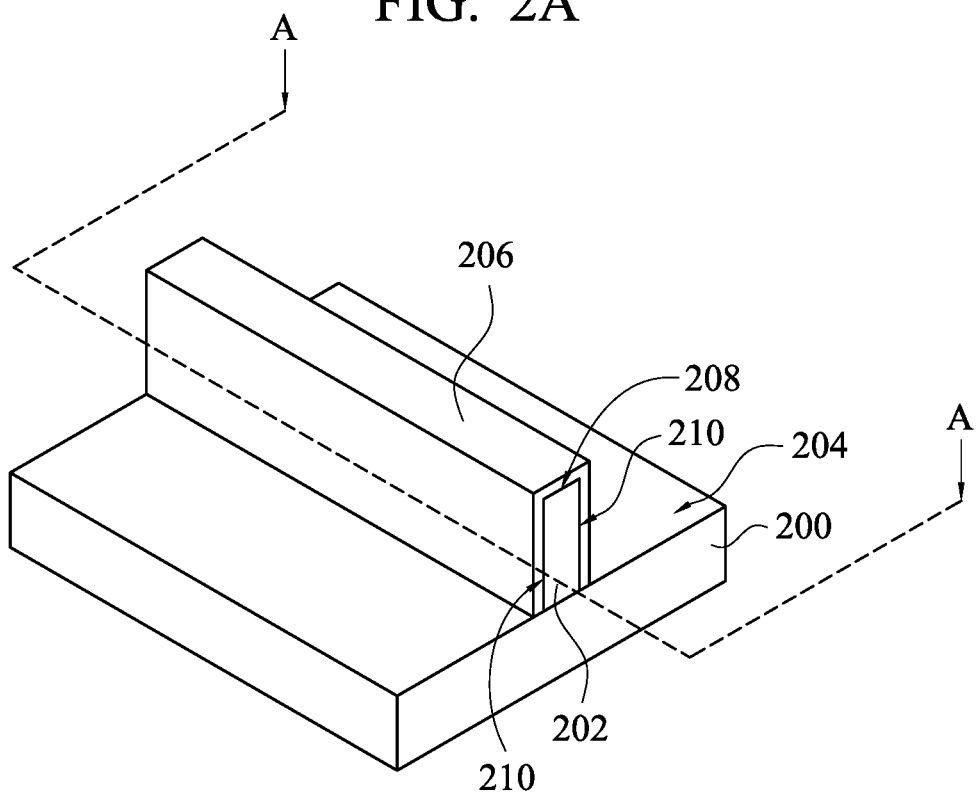
Figure 2C:
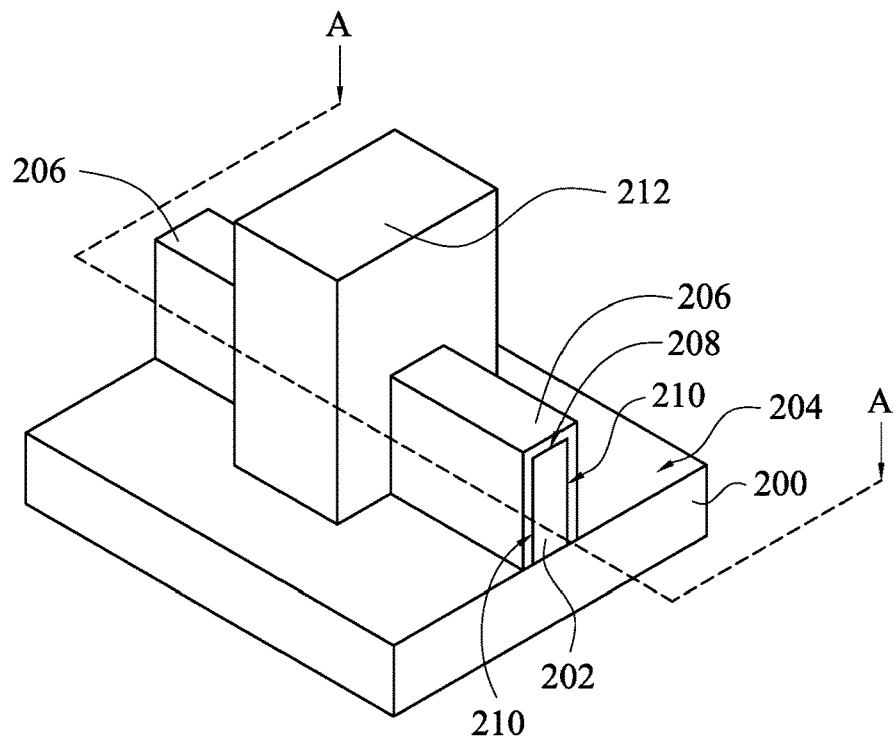
Figure 2D:
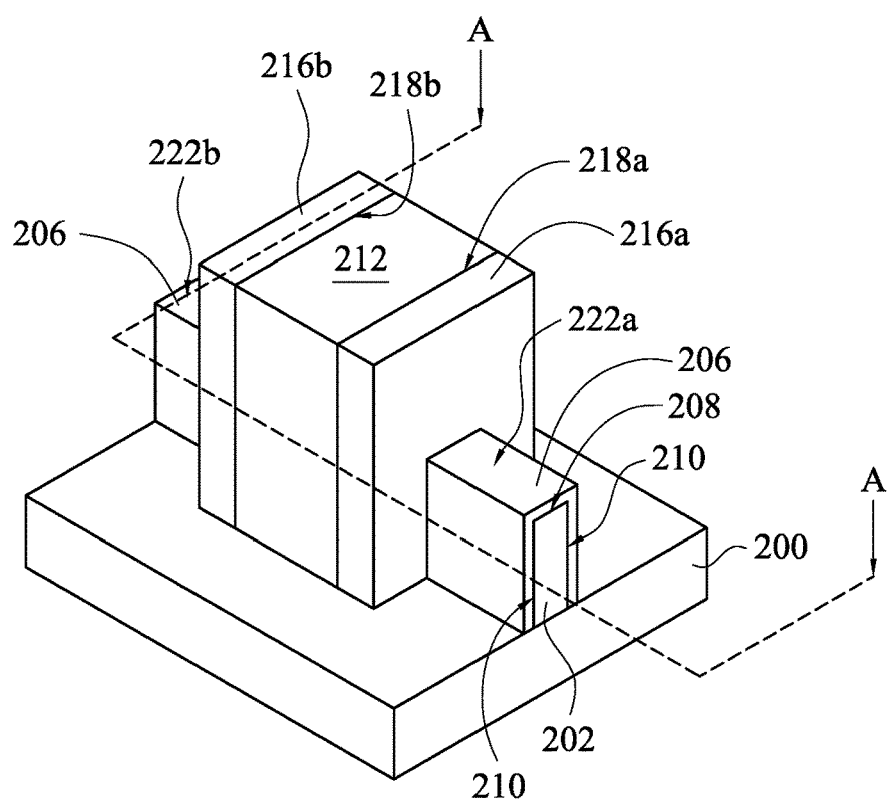
Figure 2E:
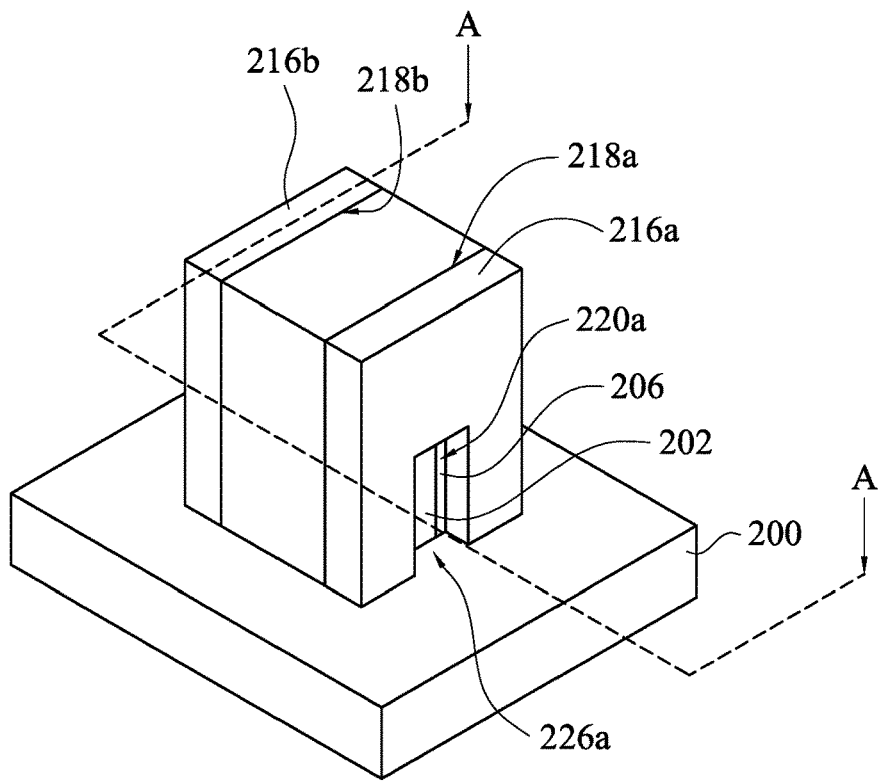
Figure 2F:
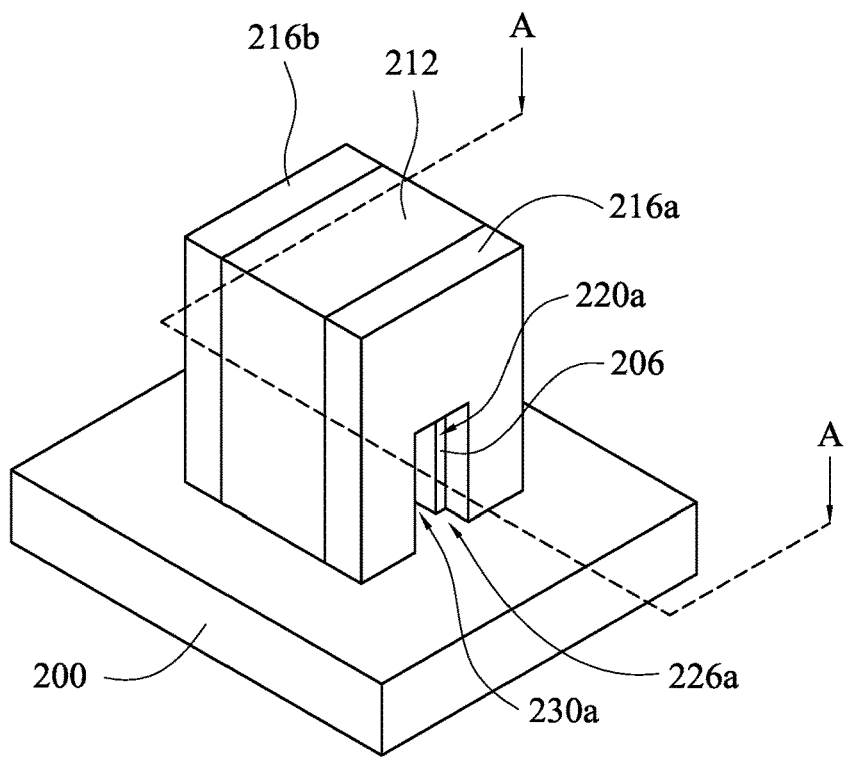
Figure 2G:
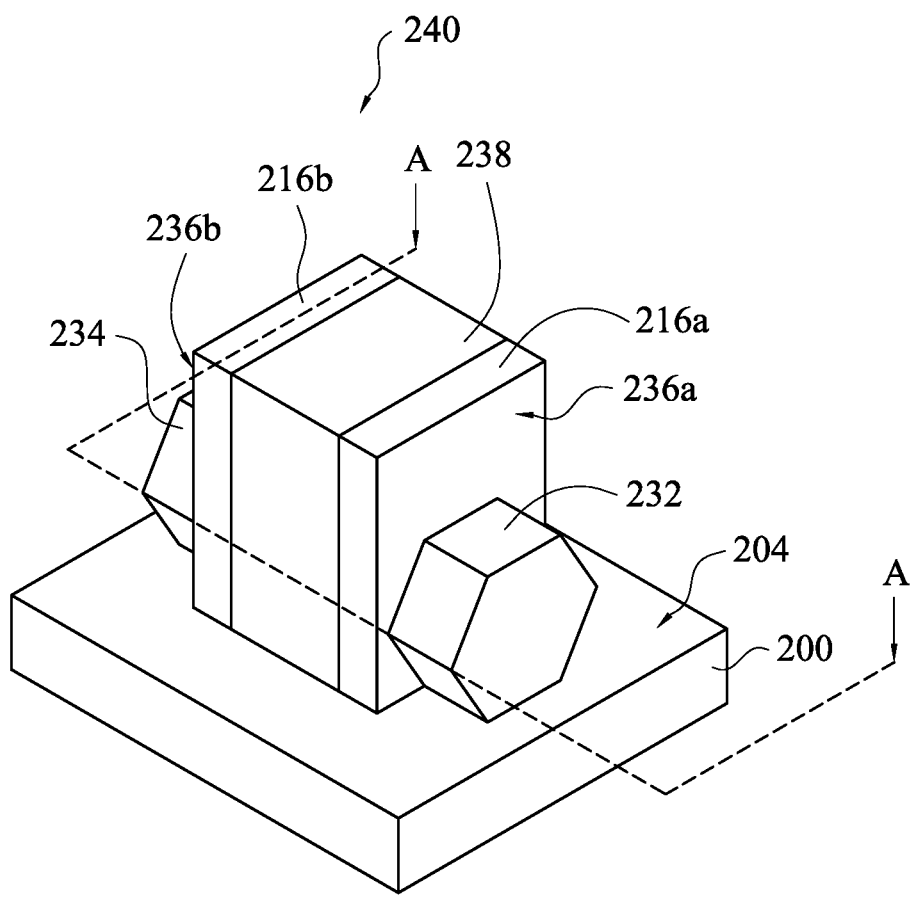
Figure 3A:
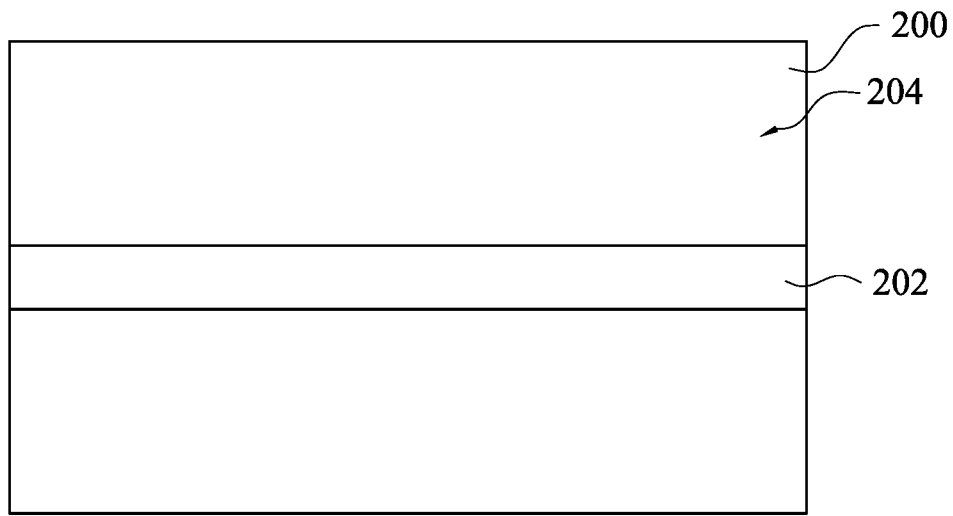
FIG. 3A through FIG. 3G are schematic top views of the FinFET taken along line A-A of FIG. 2A through 2G respectively.

Referring to FIG. 2A through FIG. 2G and FIG. 3A through FIG. 3G, FIG. 2A through FIG. 2G are three-dimensional diagrams of intermediate stages showing a method for manufacturing a FinFET in accordance with various embodiments, and FIG. 3A through FIG. 3G are schematic top views of the FinFET taken along line A-A of FIG. 2A through 2G respectively. As shown in FIG. 2A and FIG. 3A, a substrate 200 is provided. In some examples, the substrate 200 may be optionally recessed to form a fin structure 202 on a surface 204 of the substrate 200 by using, for example, a photolithography process and an etching process.

In the operation of recessing the substrate 200, a portion of the substrate 200 is removed. In such examples, the fin structure 202 is composed of a portion of the substrate 200, such that the fin structure 202 is formed from a material the same as that of the substrate 200. The substrate 200 and the fin structure 202 may be composed of a single-crystalline semiconductor material or a compound semiconductor material. In some examples, silicon, germanium or glass may be used as a material of the substrate 200 and the fin structure 202. In some exemplary examples, the substrate 200 and the fin structure 202 are formed from silicon.

Figure 3B:
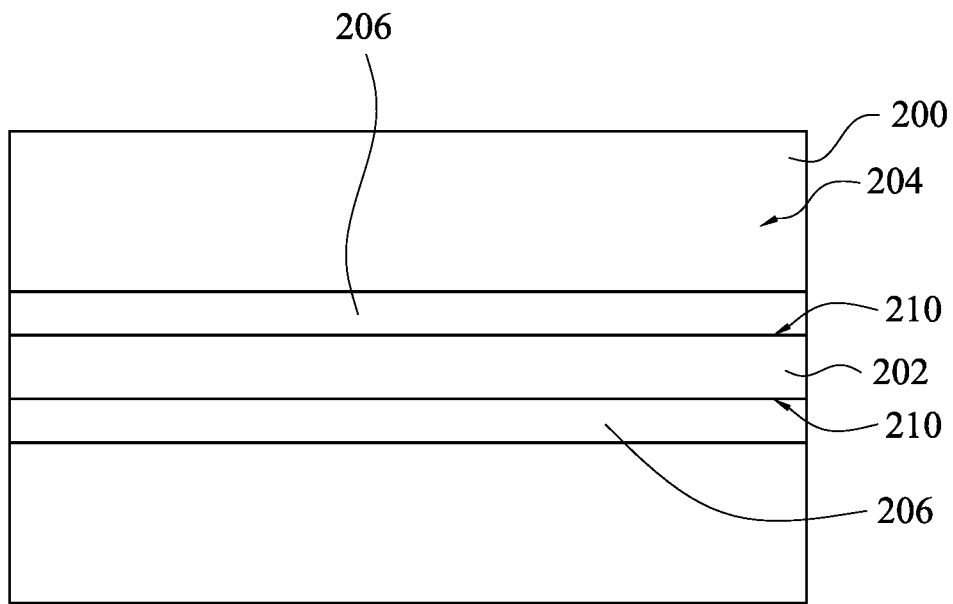

As shown in FIG. 2B and FIG. 3B, a dielectric layer 206 is formed on a top surface 208 and two opposite side surfaces 210 of the fin structure 202. In the fin structure 202, the side surfaces 210 are connected to two opposite edges of the top surface 208. For example, the side surfaces 210 may extend along an extending direction of the fin structure. Thus, a cross-section of each of the dielectric layer 206 is in an inverted U-shape. For example, the dielectric layer 206 may be formed by using a deposition process or a thermal oxidation process. The deposition process may be a chemical vapor deposition (CVD) process or a plasma-enhanced chemical vapor deposition (PECVD) process. In some examples, the fin structure 202 and the dielectric layer 206 are formed from different materials, such that the dielectric layer 206 has an etching selectivity with respect to the fin structure 202 during an operation of etching the fin structure 202. For example, the fin structure 202 may be formed from silicon, and the dielectric layer 206 may be formed from silicon oxide.

Figure 3C:
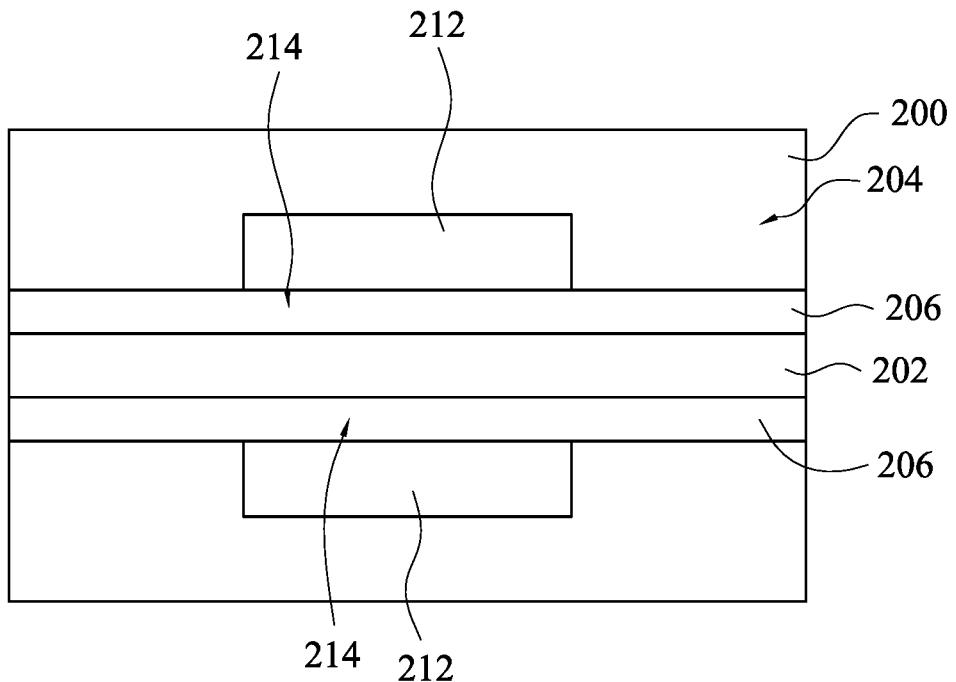

As shown in FIG. 2C and FIG. 3C, a dummy gate 212 is formed on a first portion 214 of the dielectric layer 206. In some exemplary examples, the dummy gate 212 extends from one of the side surfaces 210 to the other one of the side surfaces 210 through the top surface 208 of the fin structure 202, such that a cross-section of the dummy gate 212 is in an inverted U-shape. In some examples, the dummy gate 212 is formed by using a deposition process and an etching process. The deposition process may be a chemical vapor deposition process or a plasma-enhanced chemical vapor deposition process, for example. In some exemplary examples, the dummy gate 212 is formed from polysilicon.

Figure 3D:
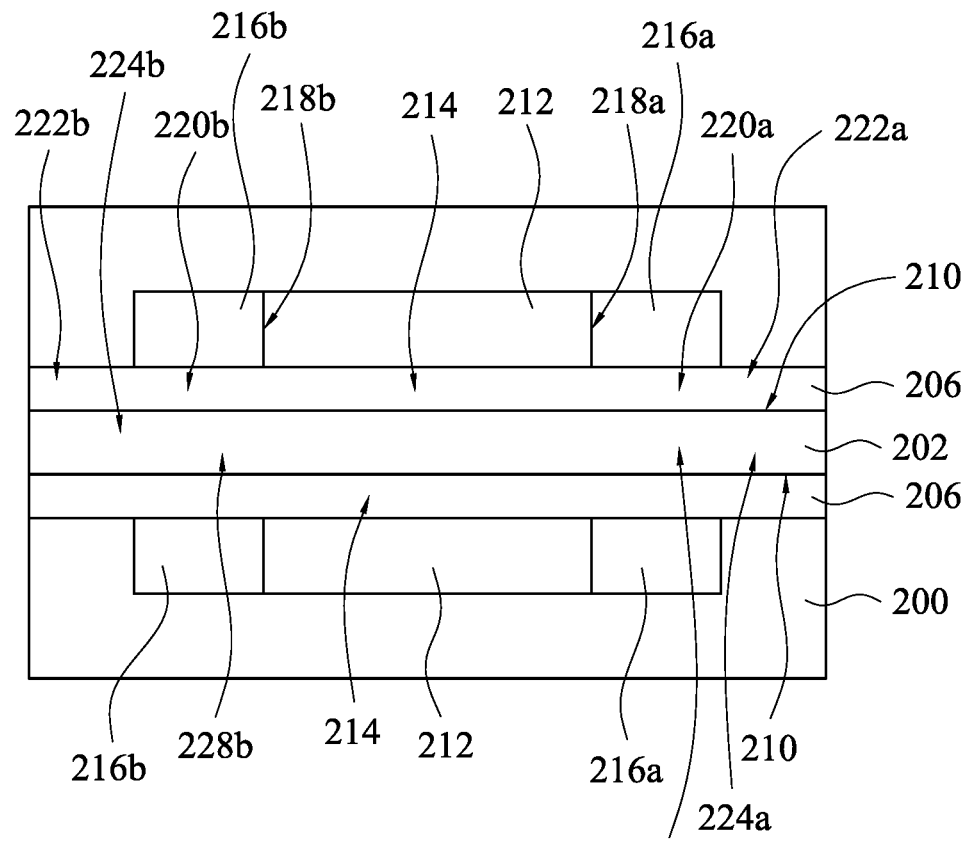

As shown in FIG. 2D and FIG. 3D, two spacers 216a and 216b are respectively formed on two opposite sidewalls 218a and 218b of the dummy gate 212. In some examples, an operation of forming the spacers 216a and 216b includes forming the spacers 216a and 216b on two second portions 220a and 220b of the dielectric layer 206 respectively, and exposing two third portions 222a and 222b of the dielectric layer 206. In the dielectric layer 206, the second portion 220a is located between the first portion 214 and the third portion 222a, and the second portion 220b is located between the first portion 214 and the third portion 222b. For example, the second portions 220a and 220b are closely adjacent to opposite sides of the first portion 214 respectively, and the third portions 222a and 222b are closely adjacent to the second portions 220a and 220b respectively.

As shown in FIG. 2D, each of the spacers 216a and 216b extends from one of the side surfaces 210 to the other one of the side surfaces 210 through the top surface 208 of the fin structure 202, such that a cross-section of each of the spacers 216a and 216b is in an inverted U-shape. For example, the spacers 216a and 216b are formed by using a deposition process and an etching process. The deposition process may be a chemical vapor deposition process or a physical vapor deposition (PVD) process, for example. The etching process may be an etching back process. In some examples, the spacers 216a and 216b and the fin structure 202 are formed from different materials, such that the spacers 216a and 216b have an etching selectivity with respect to the fin structure 202 during an operation of etching the fin structure 202. In some exemplary examples, the spacers 216a and 216b, the dielectric layer 206 and the fin structure 202 are formed from different materials. For example, the spacers 216a and 216b may be formed from silicon nitride, while the fin structure 202 may be formed from silicon, and the dielectric layer 206 may be formed from silicon oxide.

Figure 3E:
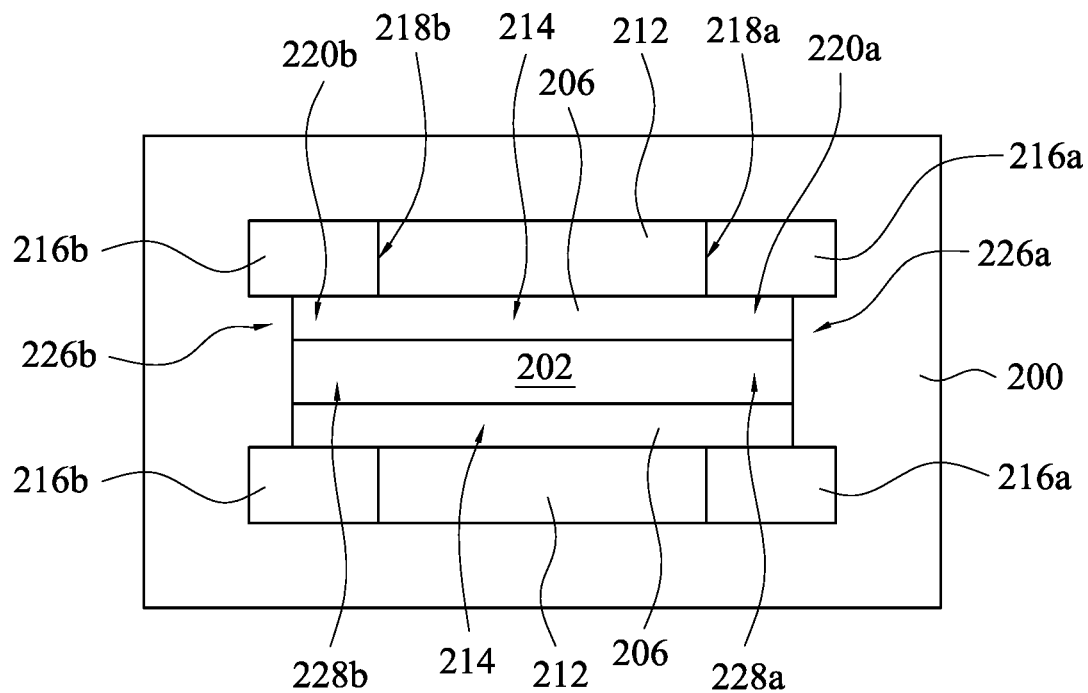

Referring to FIG. 3D, a first etching operation is performed on the dielectric layer 206 and the fin structure 202 to remove the third portions 222a and 222b and a portion of each of the second portions 220a and 220b of the dielectric layer 206, and two first portions 224a and 224b of the fin structure 202 underlying the third portions 222a and 222b and the portions of the second portions 220a and 220b of the dielectric layer 206. As shown in FIG. 2E and FIG. 3E, after the first etching operation is completed, the spacers 216a and 216b respectively protrude from the first portions 220a and 220b of the dielectric layer 206, so as to form two first recesses 226a and 226b in the spacers 216a and 216b respectively. In some examples, the first etching operation is a high bias etching operation. The first etching operation may be performed by using a dry etching technique.

Figure 3F:
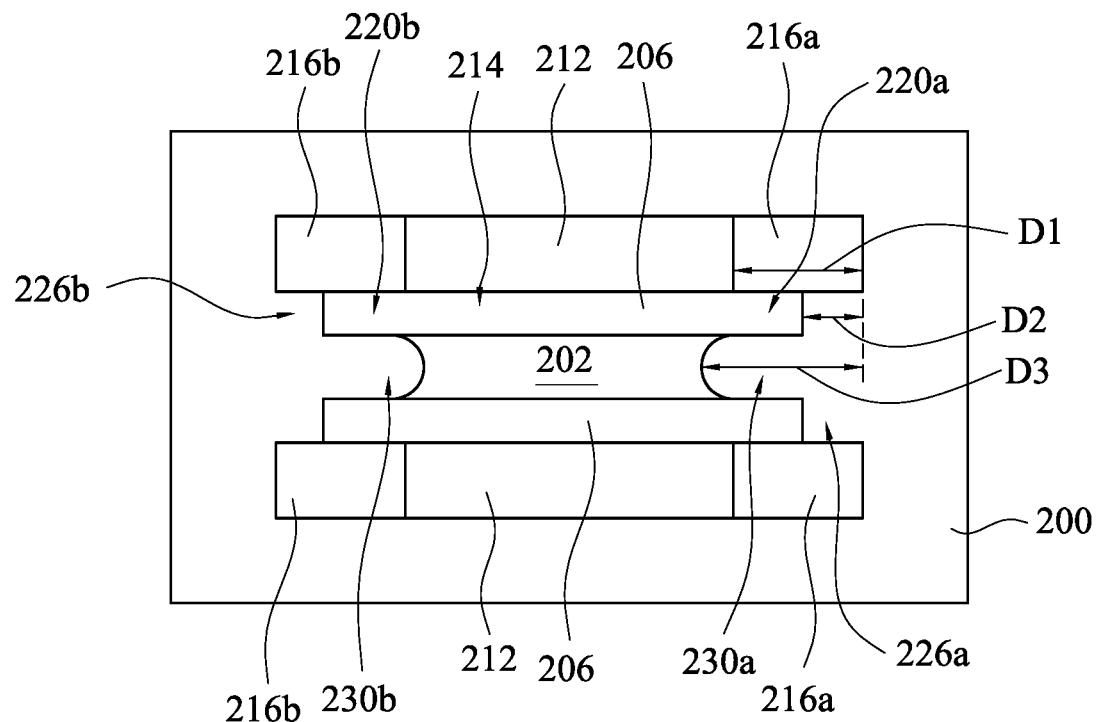

Referring to FIG. 3D and FIG. 3E simultaneously, a second etching operation is performed on the fin structure 202 to remove two second portions 228a and 228b of the fin structure 202 which are respectively adjacent to the first portions 224a and 224b of the fin structure 202. As shown in FIG. 2F and FIG. 3F, after the second etching operation is completed, the remaining second portions 220a and 220b of the dielectric layer 206 protrude from two opposite ends of the fin structure 202 to respectively form second recesses 230a and 230b in the dielectric layer 206. The second recesses 230a and 230b correspondingly communicate with the first recesses 226a and 226b. In some examples, the second etching operation is a high selectivity etching operation, and the dielectric layer 206 has an etching selectivity with respect to the fin structure 202 during the second etching operation. Thus, a cross-section of each of the second portions 220a and 220b of the dielectric layer may be in an inverted U-shape after the second etching operation is completed. The second etching operation may be performed by using a dry etching technique.

Referring to FIG. 3F again, with a two-step etching process, the fin structure 202 is further recessed to form the second recesses 230a and 230b during the second etching operation, such that a length D1 of each of the spacers 216a and 216b is greater than a length D2 of each of the first recesses 226a and 226b, and a length D3 of a combination of the first recess 226a and the second recess 230a or a combination of the first recess 226b and the second recess 230b is greater than the length D1 of each of the spacers 216a and 216b. In some exemplary examples, the length D1, the length D2 and the length D3 are within a range from 0.5 Å to 100 Å.

By using a two-step etching process, the second recesses 230a and 230b are respectively formed in the second portions 220a and 220b of the dielectric layer 206, such that extrusion paths of the dummy gate 212 are increased with the existence of the second portions 220a and 220b of the dielectric layer 206, and thus the dummy gate 212 can be effectively blocked by the second portions 220a and 220b of the dielectric layer 206.

In some examples, after the second etching operation is completed, a wet clean operation may be optionally performed on the first recesses 226a and 226b and the second recesses 230a and 230b to remove particles, products and/or contaminants from the first recesses 226a and 226b and the second recesses 230a and 230b. During the wet clean operation, the dummy gate 212 can be effectively protected by the second portions 220a and 220b of the dielectric layer 206, thereby preventing the dummy gate 212 from extruding.

Figure 3G:
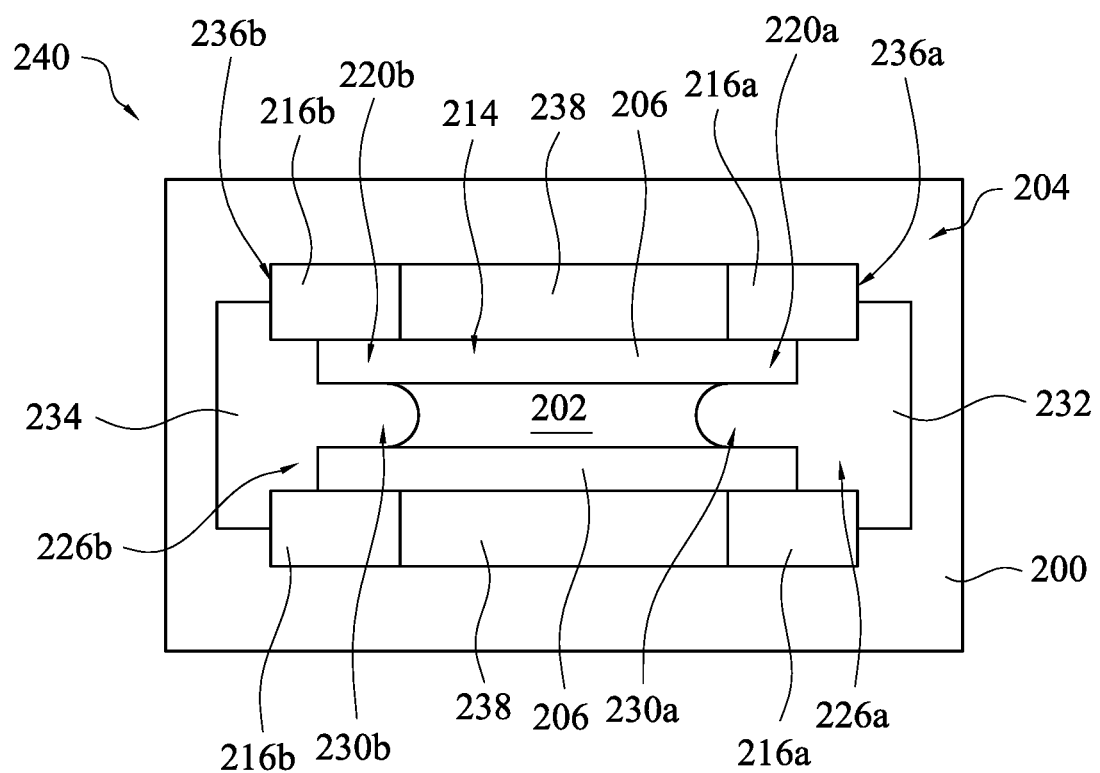

As shown in FIG. 2G and FIG. 3G, a source 232 may be formed in the first recess 226a and the second recess 230a on the substrate 200, and a drain 234 may be formed in the first recess 226b and the second recess 230b on the substrate 200. For example, the source 232 may be formed to fill the first recess 226a and the second recess 230a and protrude from the spacer 216a, such that the source 232 may cover a portion of an outer surface 236a of the spacer 216a and a portion of the surface 204 of the substrate 200. The drain 234 may be formed to fill the first recess 226b and the second recess 230b and protrude from the spacer 216b, such that the drain 234 may cover a portion of an outer surface 236b of the spacer 216b and a portion of the surface 204 of the substrate 200. In some examples, an operation of forming the source 232 and the drain 234 is performed by using an epitaxy process. In some exemplary examples, each of the source 232 and the drain 234 is formed to include a silicon germanium (SiGe) layer.

Referring to FIG. 2F and FIG. 2G simultaneously, after the source 232 and the drain 234 are completed, the dummy gate 212 are replaced with a metal gate 238 to complete a FinFET 240. In some examples, an operation of replacing the dummy gate 212 includes removing the dummy gate 212 to form a recess between the spacers 216a and 216b and expose the first portion 214 of the dielectric layer 206, and forming the metal gate 238 fill the recess and cover the first portion 214 of the dielectric layer 206. For example, an operation of removing the dummy gate 212 may be performed using a dry etching technique or a wet etching technique. An operation of forming the metal gate 238 may be performed by using a deposition process and a patterning process, in which the deposition process may be a chemical vapor deposition process or a physical vapor deposition process, and the patterning process may include a chemical mechanical polishing process.

Figure 4:
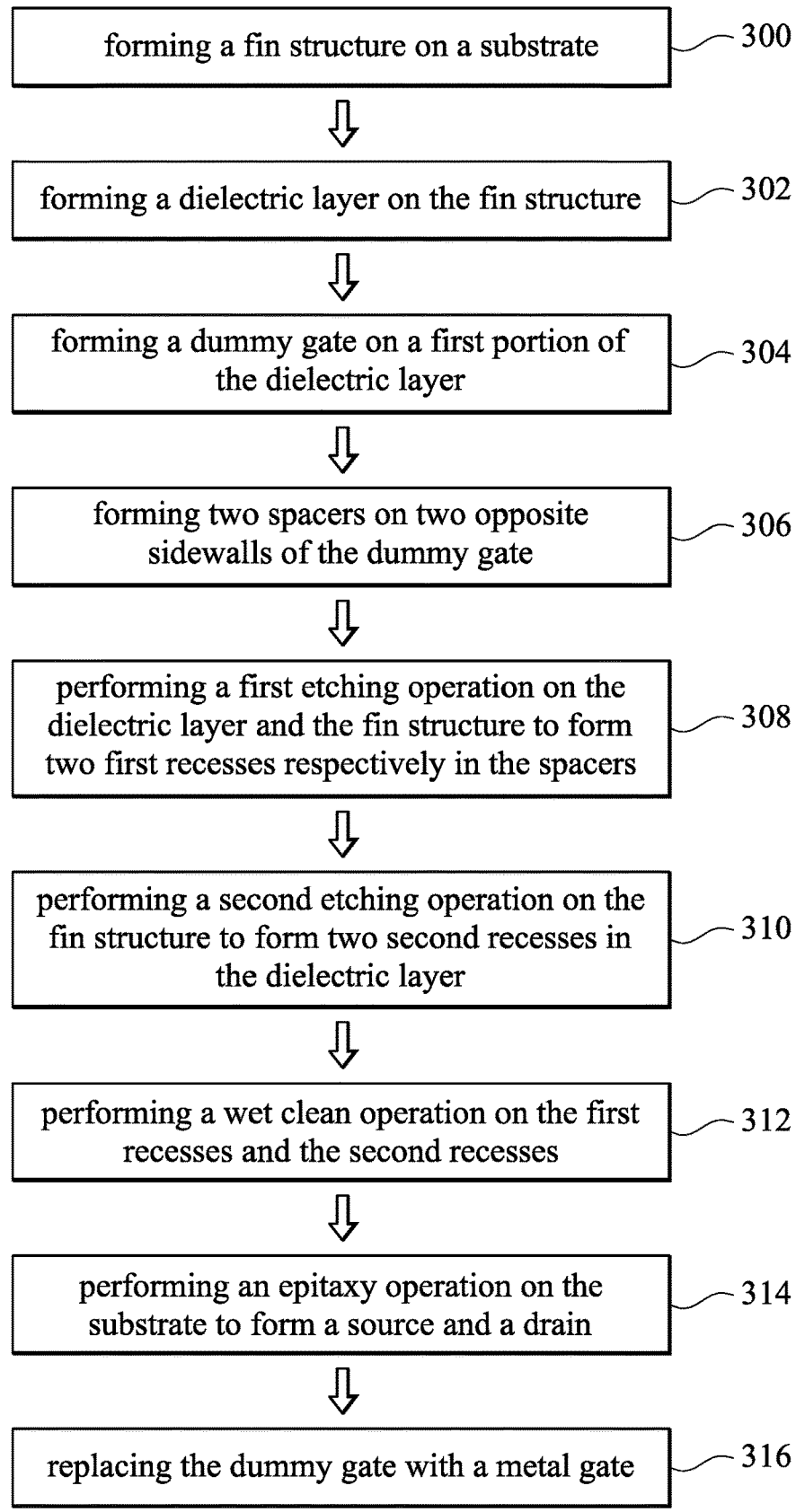
FIG. 4 is a flow chart of a method for manufacturing a FinFET in accordance with various embodiments.

Referring to FIG. 4 with FIG. 2A through FIG. 2G and FIG. 3A through FIG. 3G, FIG. 4 is a flow chart of a method for manufacturing a FinFET in accordance with various embodiments. The method begins at operation 300, where a substrate 200 is provided. In some examples, the substrate 200 may be optionally recessed to form a fin structure 202 on a surface 204 of the substrate 200 by using, for example, a photolithography process and an etching process. In the operation of recessing the substrate 200, a portion of the substrate 200 is removed. In such examples, the fin structure 202 is composed of a portion of the substrate 200, such that the fin structure 202 is formed from a material the same as that of the substrate 200. In some examples, silicon, germanium or glass may be used as a material of the substrate 200 and the fin structure 202.

At operation 302, as shown in FIG. 2B and FIG. 3B, a dielectric layer 206 is formed on a top surface 208 and two opposite side surfaces 210 of the fin structure 202. In the fin structure 202, the side surfaces 210 are connected to two opposite edges of the top surface 208. For example, the dielectric layer 206 may be formed by using a deposition process or a thermal oxidation process. The deposition process may be a chemical vapor deposition process or a plasma-enhanced chemical vapor deposition process. The fin structure 202 and the dielectric layer 206 are formed from different materials, such that the dielectric layer 206 has an etching selectivity with respect to the fin structure 202 during an operation of etching the fin structure 202.

At operation 304, as shown in FIG. 2C and FIG. 3C, a dummy gate 212 is formed on a first portion 214 of the dielectric layer 206 by using, for example, a deposition process and an etching process. The deposition process may be a chemical vapor deposition process or a plasma-enhanced chemical vapor deposition process. In some exemplary examples, the dummy gate 212 extends from one of the side surfaces 210 to the other one of the side surfaces 210 through the top surface 208 of the fin structure 202, such that a cross-section of the dummy gate 212 is in an inverted U-shape. In some exemplary examples, the dummy gate 212 is formed from polysilicon.

At operation 306, as shown in FIG. 2D and FIG. 3D, two spacers 216a and 216b are respectively formed on two opposite sidewalls 218a and 218b of the dummy gate 212 by using for example, a deposition process and an etching process. The deposition process may be a chemical vapor deposition process or a physical vapor deposition process. The etching process may be an etching back process. In some examples, an operation of forming the spacers 216a and 216b includes forming the spacers 216a and 216b on two second portions 220a and 220b of the dielectric layer 206 respectively, and exposing two third portions 222a and 222b of the dielectric layer 206. In the dielectric layer 206, the second portion 220a is located between the first portion 214 and the third portion 222a, and the second portion 220b is located between the first portion 214 and the third portion 222b. For example, the second portions 220a and 220b are closely adjacent to opposite sides of the first portion 214 respectively, and the third portions 222a and 222b are closely adjacent to the second portions 220a and 220b respectively, such that the second portion 220a is sandwiched between the first portion 214 and the third portion 222a, and the second portion 220b is sandwiched between the first portion 214 and the third portion 222b.

Referring to FIG. 2D again, each of the spacers 216a and 216b extends from one of the side surfaces 210 to the other one of the side surfaces 210 through the top surface 208 of the fin structure 202, such that a cross-section of each of the spacers 216a and 216b is in an inverted U-shape. In some examples, the spacers 216a and 216b and the fin structure 202 are formed from different materials, such that the spacers 216a and 216b have an etching selectivity with respect to the fin structure 202 during an operation of etching the fin structure 202. In some exemplary examples, the spacers 216a and 216b, the dielectric layer 206 and the fin structure 202 are formed from different materials. For example, the spacers 216a and 216b may be formed from silicon nitride, the fin structure 202 may be formed from silicon, and the dielectric layer 206 may be formed from silicon oxide.

At operation 308, as shown in FIG. 3D, a first etching operation is performed on the dielectric layer 206 and the fin structure 202 to remove the third portions 222a and 222b and a portion of each of the second portions 220a and 220b of the dielectric layer 206, and two first portions 224a and 224b of the fin structure 202 underlying the third portions 222a and 222b and the portions of the second portions 220a and 220b of the dielectric layer 206. In some examples, the first etching operation is a high bias etching operation. The first etching operation may be performed by using a dry etching technique. As shown in FIG. 2E and FIG. 3E, after the first etching operation is completed, the spacers 216a and 216b respectively protrude from the first portions 220a and 220b of the dielectric layer 206, so as to form two first recesses 226a and 226b in the spacers 216a and 216b respectively.

At operation 310, referring to FIG. 3D and FIG. 3E simultaneously, a second etching operation is performed on the fin structure 202 to remove two second portions 228a and 228b of the fin structure 202 which are respectively adjacent to the first portions 224a and 224b of the fin structure 202. As shown in FIG. 2F and FIG. 3F, after the second etching operation is completed, the remaining second portions 220a and 220b of the dielectric layer 206 protrude from two opposite ends of the fin structure 202 to respectively form second recesses 230a and 230b in the dielectric layer 206. The second recesses 230a and 230b respectively communicate with the first recesses 226a and 226b. In some examples, the second etching operation is a high selectivity etching operation, and the dielectric layer 206 has an etching selectivity with respect to the fin structure 202 during the second etching operation. Thus, a cross-section of each of the remaining second portions 220a and 220b of the dielectric layer may be in an inverted U-shape. The second etching operation may be performed by using a dry etching technique.

At operation 312, referring to FIG. 2F and FIG. 3F again, after the second etching operation is completed, a wet clean operation may be optionally performed on the first recesses 226a and 226b and the second recesses 230a and 230b to remove particles, products and/or contaminants from the first recesses 226a and 226b and the second recesses 230a and 230b. During the wet clean operation, the dummy gate 212 can be effectively protected by the second portions 220a and 220b of the dielectric layer 206, thereby preventing the dummy gate 212 from extruding.

At operation 314, as shown in FIG. 2G and FIG. 3G, a source 232 may be formed in the first recess 226a and the second recess 230a on the substrate 200, and a drain 234 may be formed in the first recess 226b and the second recess 230b on the substrate 200 by using an epitaxy process. For example, the source 232 may be formed to fill the first recess 226a and the second recess 230a and protrude from the spacer 216a, such that the source 232 may cover a portion of an outer surface 236a of the spacer 216a and a portion of the surface 204 of the substrate 200. The drain 234 may be formed to fill the first recess 226b and the second recess 230b and protrude from the spacer 216b, such that the drain 234 may cover a portion of an outer surface 236b of the spacer 216b and a portion of the surface 204 of the substrate 200. In some exemplary examples, each of the source 232 and the drain 234 is formed to include a silicon germanium layer.

At operation 316, referring to FIG. 2F and FIG. 2G simultaneously, after the epitaxy process is completed, the dummy gate 212 is replaced with a metal gate 238 to complete a FinFET 240. In some examples, an operation of replacing the dummy gate 212 includes removing the dummy gate 212 to form a recess between the spacers 216a and 216b and expose the first portion 214 of the dielectric layer 206, and forming the metal gate 238 fill the recess and cover the first portion 214 of the dielectric layer 206. For example, an operation of removing the dummy gate 212 may be performed using a dry etching technique or a wet etching technique. An operation of forming the metal gate 238 may be performed by using a deposition process and a patterning process, in which the deposition process may be a chemical vapor deposition process or a physical vapor deposition process, and the patterning process may include a chemical mechanical polishing process.

In some embodiments, a method includes forming a dielectric layer over a fin structure, forming a dummy gate crossing over the dielectric layer, forming a spacer on a sidewall of the dummy gate, etching the dielectric layer and the fin structure, such that the dielectric layer and the fin structure are recessed from an outer sidewall of the spacer, and etching the fin structure, such that the fin structure is recessed from an end surface of the dielectric layer.

In some embodiments, a method includes forming a semiconductor fin extending along a first direction above a substrate, forming a dielectric layer over a semiconductor fin, forming a dummy gate extending across the semiconductor fin along a second direction substantially perpendicular to the first direction, after forming the dummy gate, performing a first etching process to reduce a length of the dielectric layer and a length of the semiconductor fin along the first direction, after performing the first etching process, performing a second etching process to further reduce the length of the dielectric layer and the length of the semiconductor fin, and after performing the second etching process, replacing the dummy gate with a metal gate. In the second etching process, a length reduction of the semiconductor fin is greater than a length reduction of the dielectric layer.

In some embodiments, a method includes forming a gate across a dielectric layer over a semiconductor fin, wherein the semiconductor fin extends along a first direction, and the gate extends along a second direction substantially perpendicular to the first direction; forming spacers on either side of the gate; etching the dielectric layer and the semiconductor fin, such that the dielectric layer has a length less than a distance between outermost sidewalls of the spacers, and the semiconductor fin has a length less than the length of the dielectric layer, wherein the lengths of the dielectric layer and the semiconductor fin and the distance between the outermost sidewalls of the spacers are measured in the first direction; and after etching the dielectric layer and the semiconductor fin, forming an epitaxial source structure and an epitaxial drain structure respectively on opposite longitudinal ends of the semiconductor fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a dielectric layer over a fin structure;
    forming a dummy gate crossing over the dielectric layer;
    forming a spacer on a sidewall of the dummy gate;
    etching the dielectric layer and the fin structure, such that the dielectric layer and the fin structure are recessed from an outer sidewall of the spacer; and
    etching the fin structure, such that the fin structure is recessed from an end surface of the dielectric layer.

2. The method of claim 1, wherein etching the dielectric layer and the fin structure is performed such that the dielectric layer and the fin structure are recessed from the outer sidewall of the spacer to form a first recess, and a depth of the first recess is less than a thickness of the spacer.

3. The method of claim 2, wherein etching the fin structure is performed such that the fin structure is recessed from the end surface of the dielectric layer to form a second recess, the second recess is in communication with the first recess, and a depth of a combination of the first and second recesses is greater than the thickness of the spacer.

4. The method of claim 1, further comprising:
    epitaxially growing an epitaxy structure adjoining the etched fin structure.

5. The method of claim 4, further comprising:
    performing a wet clean operation to the etched fin structure prior to epitaxially growing the epitaxy structure.

6. The method of claim 1, further comprising:
    replacing the dummy gate with a metal gate after etching the fin structure.

7. The method of claim 1, wherein etching the fin structure is performed using a selective etching process that selectively etches the fin structure.

8. The method of claim 1, wherein etching the fin structure is performed such that the etched fin structure has an end surface more concave than the end surface of the dielectric layer.

9. The method of claim 1, wherein etching the dielectric layer and the fin structure is performed such that the fin structure has an end surface coterminous with the end surface of the dielectric layer.

10. The method of claim 1, wherein etching the fin structure is performed such that the fin structure has an end surface discontinuous from the end surface of the dielectric layer.

11. A method, comprising:
forming a semiconductor fin extending along a first direction above a substrate;
forming a dielectric layer over the semiconductor fin;
forming a dummy gate extending across the semiconductor fin along a second direction substantially perpendicular to the first direction;
after forming the dummy gate, performing a first etching process to reduce a length of the dielectric layer and a length of the semiconductor fin along the first direction;
after performing the first etching process, performing a second etching process to further reduce the length of the dielectric layer and the length of the semiconductor fin, wherein in the second etching process, a length reduction of the semiconductor fin is greater than a length reduction of the dielectric layer; and
after performing the second etching process, replacing the dummy gate with a metal gate.

12. The method of claim 11, wherein in the first etching process, a length reduction of the semiconductor fin is comparable to a length reduction of the dielectric layer.

13. The method of claim 11, further comprising:
prior to performing the first etching process, forming spacers on either side of the dummy gate.

14. The method of claim 13, wherein the spacers remain substantially intact in the first etching process.

15. The method of claim 13, wherein the spacers remain substantially intact in the second etching process.

16. The method of claim 11, further comprising:
forming source/drain epitaxy structures on opposite sides of the dummy gate after performing the second etching process and before replacing the dummy gate with the metal gate.

17. A method, comprising:
forming a gate across a dielectric layer over a semiconductor fin, wherein the semiconductor fin extends along a first direction, and the gate extends along a second direction substantially perpendicular to the first direction;
forming spacers on either side of the gate;
etching the dielectric layer and the semiconductor fin such that the dielectric layer has a length less than a distance between outermost sidewalls of the spacers and the semiconductor fin has a length less than the length of the dielectric layer, wherein the lengths of the dielectric layer and the semiconductor fin and the distance between the outermost sidewalls of the spacers are measured in the first direction; and
after etching the dielectric layer and the semiconductor fin, forming an epitaxial source structure and an epitaxial drain structure respectively on opposite longitudinal ends of the semiconductor fin.

18. The method of claim 17, wherein etching the dielectric layer and the semiconductor fin is performed such that the longitudinal ends of the semiconductor fin are more concave than end surfaces of the dielectric layer.

19. The method of claim 17, wherein etching the dielectric layer and the semiconductor fin is performed such that the longitudinal ends of the semiconductor fin are more concave than the outermost sidewalls of the spacers.

20. The method of claim 17, further comprising:
after forming the epitaxial source structure and the epitaxial drain structure, replacing the gate with a metal gate.

* * * * *